(12) United States Patent
Jolley

(10) Patent No.: US 6,217,667 B1
(45) Date of Patent: Apr. 17, 2001

(54) METHOD FOR CLEANING COPPER SURFACES

(75) Inventor: Michael Jolley, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/406,908

(22) Filed: Sep. 24, 1999

(51) Int. Cl.$^7$ ....................................................... B08B 5/00
(52) U.S. Cl. .................. 134/2; 134/1.3; 134/19; 134/21; 134/22.17; 134/22.18; 134/25.4; 134/26; 134/29; 134/30; 134/35; 134/36; 134/42; 134/902
(58) Field of Search .................... 134/1.3, 2, 19, 134/21, 22.17, 22.18, 25.4, 26, 29, 30, 35, 36, 42, 902

(56) References Cited

U.S. PATENT DOCUMENTS

| | | | |
|---|---|---|---|
| 3,231,503 | * | 1/1966 | Laue et al. ........................ 252/79.1 |
| 3,438,811 | * | 4/1969 | Harriman ................................ 134/2 |
| 3,650,744 | * | 3/1972 | Kunz et al. ........................... 96/35.1 |
| 3,833,384 | * | 9/1974 | Noonan et al. ..................... 96/115 P |
| 4,554,182 | * | 11/1985 | Bupp et al. ........................... 427/304 |
| 4,639,380 | * | 1/1987 | Amelio et al. ......................... 427/97 |
| 4,776,892 | * | 10/1988 | Steppan et al. ....................... 134/38 |
| 5,014,727 | * | 5/1991 | Aigo ..................................... 134/102 |
| 5,091,103 | * | 2/1992 | Dean et al. .......................... 252/162 |
| 5,415,972 | * | 5/1995 | Mayes .................................. 430/260 |
| 5,904,156 | * | 5/1999 | Advocate, Jr. et al ................. 134/2 |
| 5,962,183 | * | 10/1999 | Rahman et al. .................. 430/270.1 |
| 5,980,643 | * | 11/1999 | Jolley ..................................... 134/2 |
| 6,021,791 | * | 2/2000 | Dryer et al. ...................... 134/100.1 |

* cited by examiner

*Primary Examiner*—S. Carrillo
(74) *Attorney, Agent, or Firm*—Lyon & Lyon LLP

(57) ABSTRACT

In a method for cleaning a copper surface of a semiconductor wafer or article, nitrogen gas is bubbled or dissolved into a strong alkaline solution, displacing dissolved oxygen from the solution. A nitrogen gas environment is provided over the copper surface. The alkaline solution is then applied to the copper surface. The copper etch rate is greatly reduced. The method is useful in removing residual polishing slurry after a chemical-mechanical polishing step, and for removing residues left in via holes after plasma etching.

14 Claims, No Drawings

METHOD FOR CLEANING COPPER SURFACES

FIELD OF THE INVENTION

The field of the invention is manufacturing of semiconductor micro-electronic devices.

BACKGROUND OF THE INVENTION

Micro-electronic devices are used in a wide range of electronic products. These devices are typically manufactured from semiconductor (most often silicon) wafers. Using photolithography techniques, thousands of discrete electronic components, such as transistors, can be manufactured on a single silicon chip, with many silicon chips produced from a single wafer. The components on the chip, and the interconnections (or wiring) between them are formed in part with a metal, most often aluminum. However, recently, the semiconductor industry has moved towards using copper in place of aluminum, as copper provides several advantages. Consequently, copper metalization techniques are currently being actively researched.

Manufacturing of semiconductor devices with copper requires several critical cleaning steps. The first, a chemical-mechanical polishing step, is required after the copper interconnections or wiring have been formed, with an inlay process. This step uses a polishing slurry. When this polishing step is completed, the copper surfaces are contaminated with residual polishing slurry. The slurry must be removed from both the copper surfaces and the oxide surfaces.

A second cleaning step is required after the via etching step. Residues are left in the via hole after the plasma etching step, and must be removed.

In the past, strong alkaline solutions have been successfully used, with aluminum surfaces on semiconductor devices, to remove slurry after polishing steps, and also to remove residue in via holes after plasma etching. However, with semiconductor devices using copper, strong alkaline solutions are unacceptable and have not been used, because these solutions have an excessive etch rate on the copper, relative to the surrounding dielectric film. In addition, strong alkaline solutions form hydroxide film on the copper surface.

Accordingly, there is a need in the semiconductor industry for improved techniques for cleaning copper surfaces.

SUMMARY OF THE INVENTION

To this end, a method for cleaning a copper surface of a semiconductor device includes the steps of purging the environment around the copper surfaces using nitrogen gas. The alkaline solution is then applied to the copper surface within the nitrogen environment. As oxygen is displaced, the copper etch rate is greatly reduced, and the shiny metallic copper surface is not degraded.

In a second separate aspect of the invention, nitrogen is introduced into the alkaline solution, to remove oxygen from the solution, thereby reducing the oxidation potential of the solution.

In a third aspect of the invention, the alkaline solution is heated to 60–85° C.

Other and further objects and advantages will appear hereinafter.

DETAILED DESCRIPTION OF THE METHODS

Following the chemical-mechanical polishing step, and the plasma etching step, in the manufacture of a semiconductor device e.g., on a silicon wafer using copper, the residual polishing slurry and residues must be removed. Strong alkaline solutions are used within a nitrogen environment.

The strong alkaline solutions include tetramethyl ammonium hydroxide (TMAH), an alkaline solution widely used in the semiconductor industry. Other alkaline mixtures which may also be used include sodium hydroxide (NaOH); potassium hydroxide (KOH), and Choline (a quaternary ammonium compound). Of course, less common other alkaline mixtures may also be used.

The nitrogen purge can be accomplished through several ways. The semiconductor wafers (or other similar articles to be cleaned) may be placed into a process chamber, in any one of many semiconductor processing machines. Nitrogen gas is then pumped into the process chamber, displacing the ambient gas present in the chamber, typically air, including oxygen as a component part. The nitrogen gas displaces oxygen, creating an atmosphere inert in the sense that the copper surfaces are less prone to etching by the alkaline solution.

The nitrogen alternatively can be sprayed into the chamber in a nitrogen purge. The nitrogen may be sprayed onto the copper surface of the semiconductor article. Alternatively, the process may be practiced without any sealed chamber, so long as a nitrogen atmosphere is created over the copper surfaces. The process is suitable for use with single wafer processing equipment, or for use with equipment which processes batches of wafers or articles.

With the copper surfaces within the nitrogen atmosphere, the alkaline solution is then applied to the copper surfaces. The alkaline solution can be applied by spraying, using existing semiconductor processing equipment having spray nozzles or manifolds for spraying liquid into a process chamber. Alternatively, the semiconductor article can be immersed into a bath of the solution.

Nitrogen is also preferably introduced into the alkaline solution (to displace oxygen from the solution). This can be achieved by bubbling nitrogen through the alkaline solution, or using various membrane methods. Preferably, the nitrogen is dissolved into the alkaline solution. The introduction of the nitrogen into the alkaline solution preferably occurs in the alkaline solution storage tank, so that the alkaline solution is pretreated with nitrogen before it is applied to the copper surfaces.

Experimental results show that when the alkaline cleaning step is done in an nitrogen purged environment, the copper etch rate is reduced by a factor of 10, and that the shiny metallic copper surface is not degraded. This result appears to occur due to the displacement of oxygen from the environment over the article surface, and to the displacement of dissolved oxygen in the alkaline mixture, by the nitrogen. By displacing the oxygen in the mixture, the oxidation potential is reduced, and the exposed copper surface becomes inert and less prone to etching by the mixture.

The alkaline solution is preferably heated to 60–85° C. (when using TMAH). At temperatures below about 60° C., the time required for the cleaning step becomes excessive. At temperatures above 80 or 85° C., uncontrolled drying may occur, leading to increased contamination.

Thus, a novel method for cleaning a copper surface of a semiconductor device has been described. Various changes and substitutions may of course be made without departing from the spirit and scope of the invention. The invention, therefore, should not be limited, except by the following claims and their equivalents.

What is claimed is:

1. A method for cleaning a copper surface of a semiconductor article, comprising the sequential steps of:
   placing the semiconductor article having the copper surface in a sealed processing chamber;
   purging the sealed processing chamber with nitrogen to create a nitrogen gas atmosphere around the copper surface; and
   applying an alkaline solution to the copper surface while the copper surface is within the nitrogen gas atmosphere within the sealed processing chamber, to clean the copper surface of the semiconductor article.

2. The method of claim 1 further including the step of dissolving nitrogen gas into the alkaline solution, before applying the alkaline solution to the copper surface of the semiconductor article.

3. The method of claim 1 wherein the alkaline solution comprises a member selected from the group consisting of TMAH, NaOH, KOH and Choline.

4. The method of claim 1 wherein the alkaline solution is applied by spraying.

5. The method of claim 1 further comprising the step of heating the alkaline solution to 60–85° C.

6. A method for cleaning a copper surface of a semiconductor article, comprising the sequential steps of:
   placing the semiconductor article having the copper surface in a sealed processing chamber;
   introducing nitrogen gas into the sealed processing chamber to purge ambient gases and vapors from the sealed processing chamber and to create a nitrogen gas atmosphere around the copper surface of the semiconductor article;
   dissolving nitrogen gas into an alkaline solution to displace oxygen dissolved in the alkaline solution; and
   applying the alkaline solution with the dissolved nitrogen gas to the copper surface while the copper surface is in the nitrogen gas atmosphere within the sealed processing chamber, to clean the copper surface of the semiconductor article.

7. The method of claim 6 further comprising the step of heating the alkaline solution to 60–85° C.

8. The method of claim 6 wherein the alkaline solution is sprayed onto the copper surface.

9. The method of claim 6 wherein the step of introducing nitrogen gas into the sealed processing chamber further includes the step of spraying the nitrogen gas into the sealed processing chamber.

10. The method of claim 6 wherein the step of introducing nitrogen gas into the sealed processing chamber further includes the step of spraying nitrogen gas onto the copper surface of the semiconductor article.

11. The method of claim 6 wherein the alkaline solution is a member selected from the group consisting of TMAH, KOH, and Choline.

12. The method of claim 6 wherein the nitrogen gas is dissolved into the alkaline solution in a tank, and the alkaline solution with the dissolved nitrogen gas is then applied to the copper surface in the sealed processing chamber.

13. A method for cleaning a copper surface of a semiconductor article, comprising the sequential steps of:
   providing a semiconductor article having a copper surface;
   polishing the copper surface of the semiconductor article with a polishing slurry;
   placing the semiconductor article into a sealed processing chamber;
   purging the sealed processing chamber by introducing nitrogen gas into the sealed processing chamber and creating a nitrogen gas atmosphere around the copper surface; and
   applying an alkaline solution onto the copper surface, to clean polishing slurry off of the copper surface while the copper surface of the semiconductor article is within the nitrogen gas atmosphere in the sealed processing chamber.

14. The method of claim 13 further comprising the step of introducing nitrogen gas into the alkaline solution before the alkaline solution is applied onto the copper surface.

* * * * *